United States Patent [19]
Henry

[11] 4,284,430
[45] Aug. 18, 1981

[54] CYCLIC OXIDATION RESISTANT TRANSVERSE DUCTILE FIBER REINFORCED EUTECTIC NICKEL-BASE SUPERALLOYS

[75] Inventor: Michael F. Henry, Schenectady, N.Y.

[73] Assignee: General Electric Company, Schenectady, N.Y.

[21] Appl. No.: 34,154

[22] Filed: Apr. 27, 1979

[51] Int. Cl.³ ............................................. C22C 19/03
[52] U.S. Cl. ...................................... 75/170; 75/171; 148/32; 148/32.5
[58] Field of Search .................... 75/170, 171; 148/32, 148/32.5

[56] References Cited
U.S. PATENT DOCUMENTS
3,904,402  9/1975  Smashey ............................... 75/170

Primary Examiner—R. Dean
Attorney, Agent, or Firm—F. Wesley Turner; James C. Davis, Jr.; Joseph T. Cohen

[57] ABSTRACT

A unidirectionally solidified anisotropic metallic composite body exhibiting transverse ductility, cyclic oxidation resistance, hot corrosion resistance and high temperature strength properties comprising a eutectic nickel-base superalloy containing about, on a weight basis, 2-9% Re, less than 0.8% Ti, at least 2% Mo, and less than 1% V. Embedded in the matrix is an aligned carbide reinforcing fibrous phase, preferably one selected from carbides, primarily of Ta.

10 Claims, 5 Drawing Figures

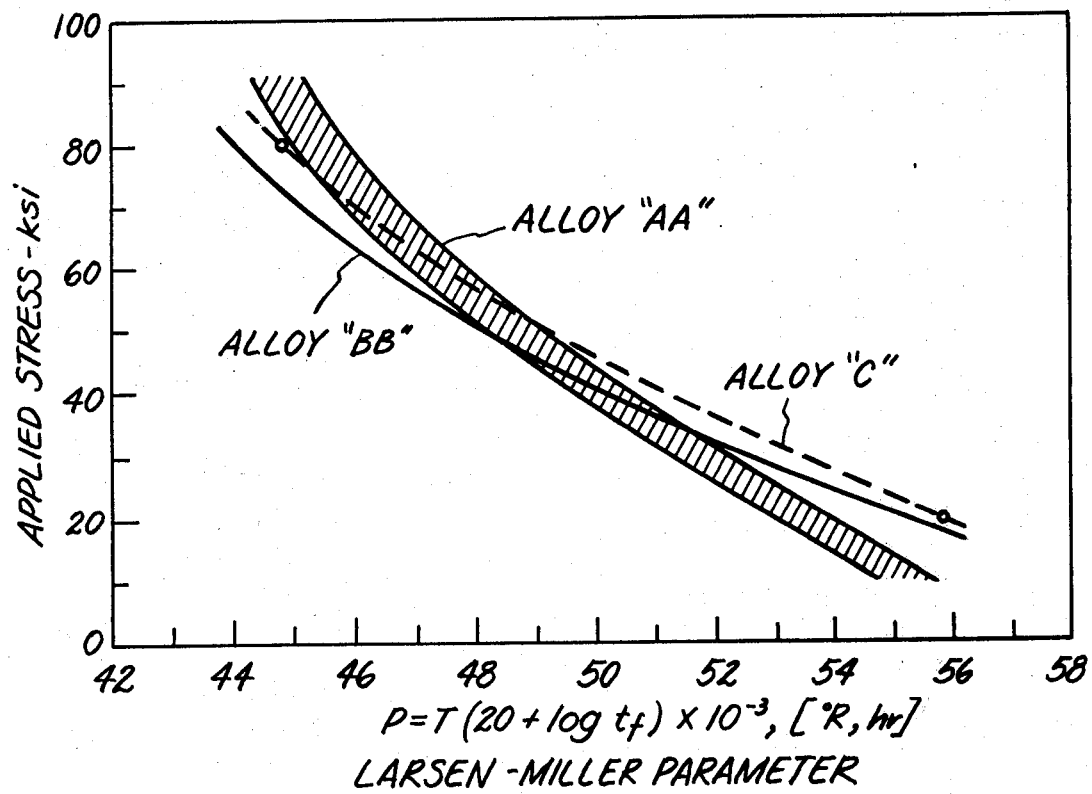

CYCLIC OXIDATION RESISTANT TRANSVERSE DUCTILE FIBER REINFORCED EUTECTIC NICKEL-BASE SUPERALLOYS

CROSS REFERENCE TO RELATED APPLICATIONS

This invention is related to copending U.S. Pat. applications Ser. Nos. 34,168 of M.F. Henry, and 34,167 of M.F.X. Gigliotti, et al., with filed April 27, 1979, respectively. The aforesaid applications are assigned to the same assignee as the assignee of this application and all the disclosure contained therein are hereby incorporated herein in their entirety by reference.

BACKGROUND OF THE INVENTION

1. Field of the Invention

This invention relates to a unidirectionally solidified anisotropic metallic composite body exhibiting transverse ductility, cyclic oxidation resistance, hot corrosion resistance and high temperature strength properties comprising a eutectic nickel-base superalloy containing about, on weight basis, 2-9% Re, less than about 0.8% Ti, at least 2% Mo, and less than 1% V. Embedded in the matrix is an aligned carbide reinforcing fibrous phase, preferably carbide(s) primarily of Ta.

2. Description of the Prior Art

Smashey's U.S. Pat. No. 3,904,402, issued Sept. 9, 1975 (filed June 1, 1973) broadly describes eutectic nickel-base alloys containing rhenium and a carbide reinforcing fiber phase exhibiting improved high temperature strength stress rupture properties. Smashey teaches the preferred use of 4-7% w/o vanadium for enhancement of carbide fiber as well as matrix strengthening. Smashey teaches the limited use of molybdenum, i.e. up to about 3% w/o, however preferably omits the use of Mo. Smashey also preferably limits tungsten to about 2-4 in nickel-base superalloys. Smashey summarily teaches the additive use of vanadium and the restrictive use of molybdenum and tungsten.

Recent studies of Smashey's alloys indicate that the alloys exhibit brittle (non-ductile) transverse strength properties as well as cyclic oxidation and hot corrosion limitations.

DESCRIPTION OF THE INVENTION

This invention embodies a unidirectionally solidified anisotropic metallic composite body exhibiting transverse ductility high temperature strength properties comprising a eutectic nickel-base superalloy containing about, on a weight % w/o basis, 2-9% Re, less than 0.8% Ti, at least 2% Mo, and less than 1% V. Embedded in the matrix is an aligned carbide reinforcing fibrous phase, preferably a predominantly TaC reinforcing fibrous phase.

This invention describes the interdependent relationships of various elements, e.g. vanadium, molybdenum and tungsten, relative to eutectic nickel-base Re containing carbide fiber reinforced superalloys.

The nickel-base alloys contain about, on a weight basis, 2-9% Re, 0-0.8% Ti, 0-10% Cr, 0-10% Al, 3-15% Ta, 0.1-1% C., 0-10% Co, 0-10% W, 0-1.0% V, 2-10% Mo, 0-3% Cb, the balance being essentially Ni and incidental impurities.

Figure 1:
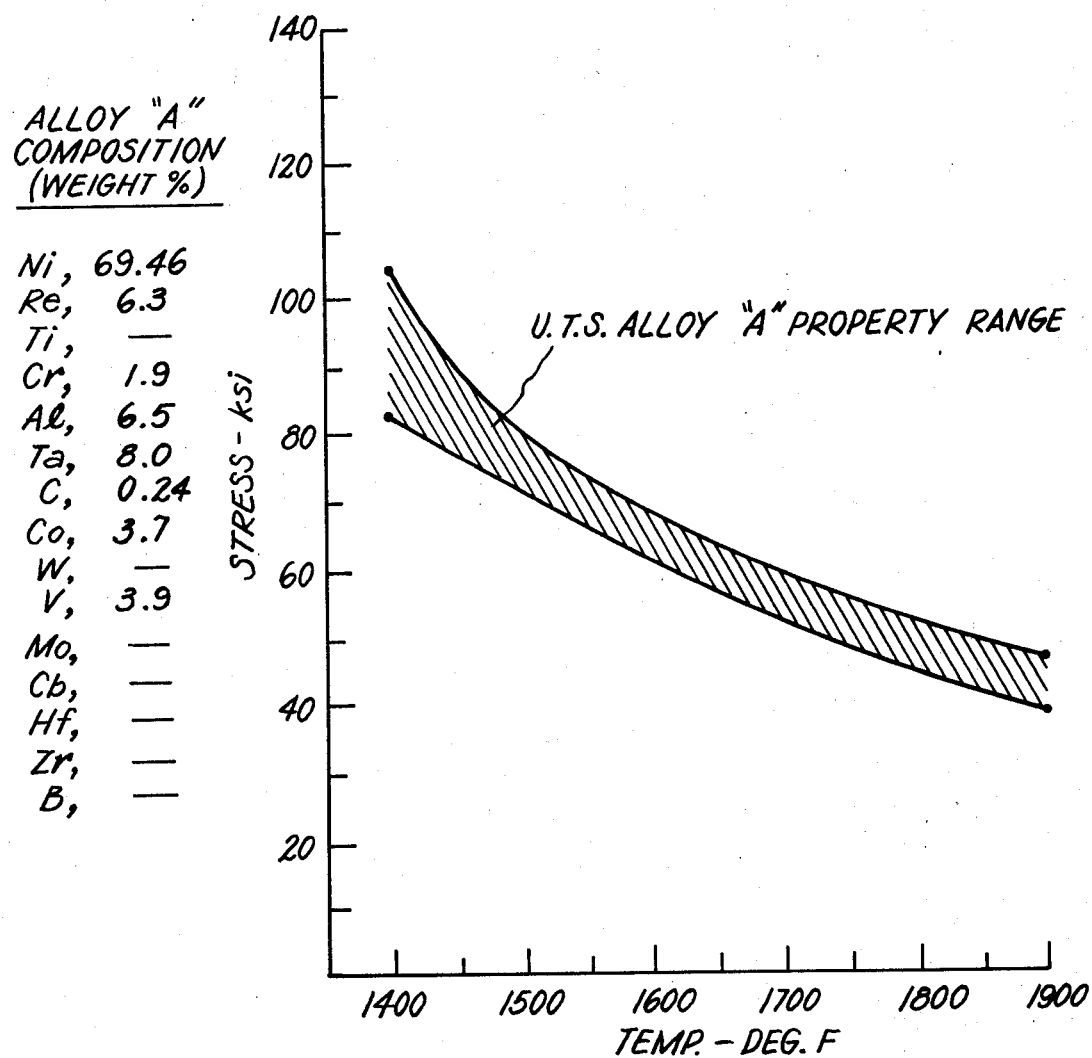
FIG. 1 is a graphical representation of the transverse tensile strength of a unidirectionally solidified eutectic nickel-base Re containing carbide fiber reinforced superalloy composition containing on a weight percent basis: 69.46 Ni, 6.3 Re, 1.9 Cr, 6.5 Al, 8.0 Ta, 0.24 C, 3.7 Co, and 3.9 V, i.e. Alloy "A". The alloy manifests little or no transverse elongation over the temperature range shown.
Figure 2:
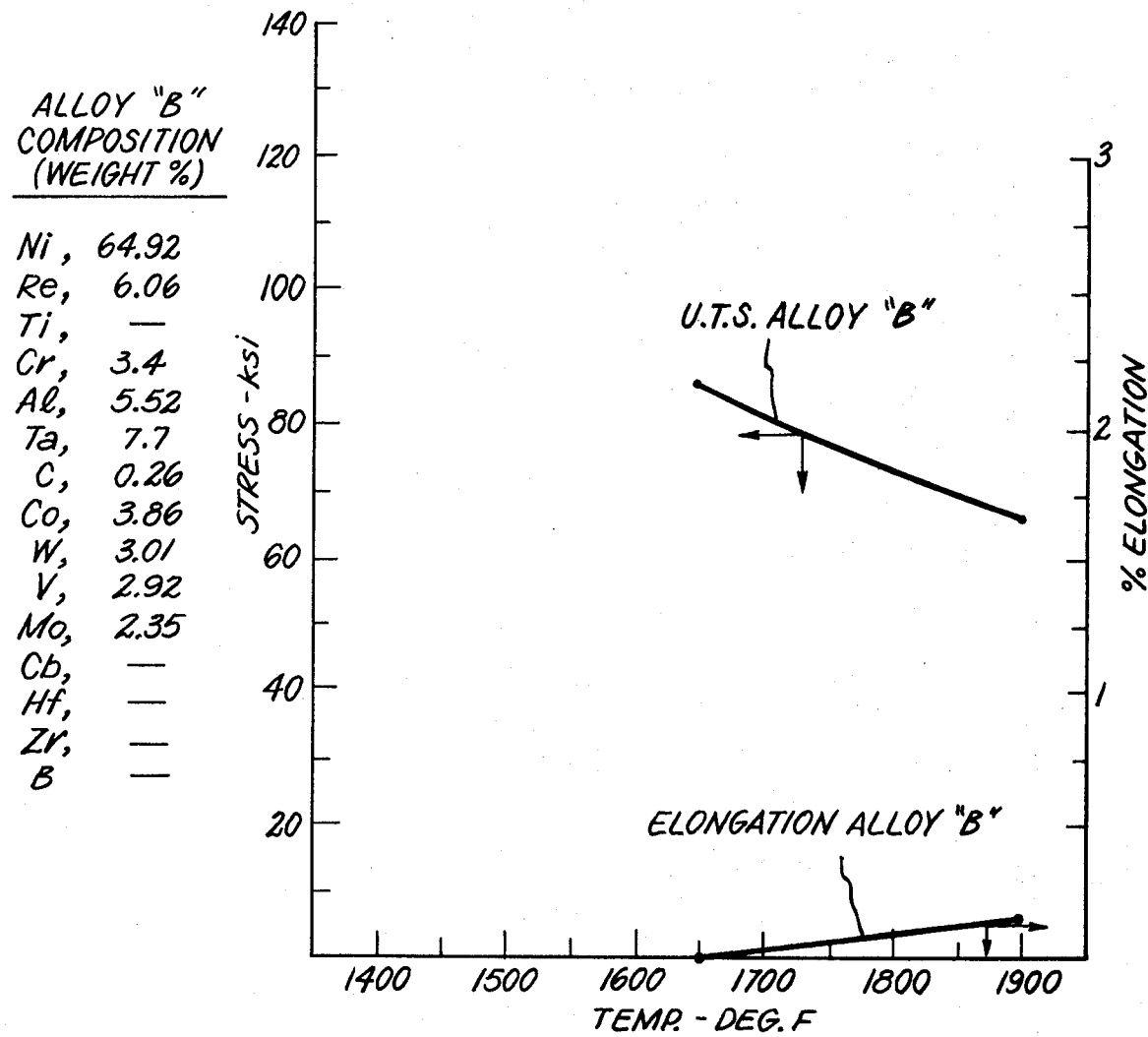
FIG. 2 is a graphical representation of the transverse tensile behavior of a directionally solidified eutectic nickel-base Re containing carbide fiber reinforced superalloy composition containing on a weight percent basis: 64.92 Ni, 6.06 Re, 3.4 Cr, 5.52 Al, 7.7 Ta, 0.26 C, 3.85 Co, 3.01 W, 2.92 V, 2.35 Mo, i.e. Alloy "B". Alloy "B", which is within the composition range of Smashey's U.S. 3,904,402, is essentially nonductile, exhibiting low transverse ductility at elevated temperatures, i.e. high temperature transverse tensile elongation values equal to or less than 0.2% at 1650° F. to 1900° F.
Figure 3:
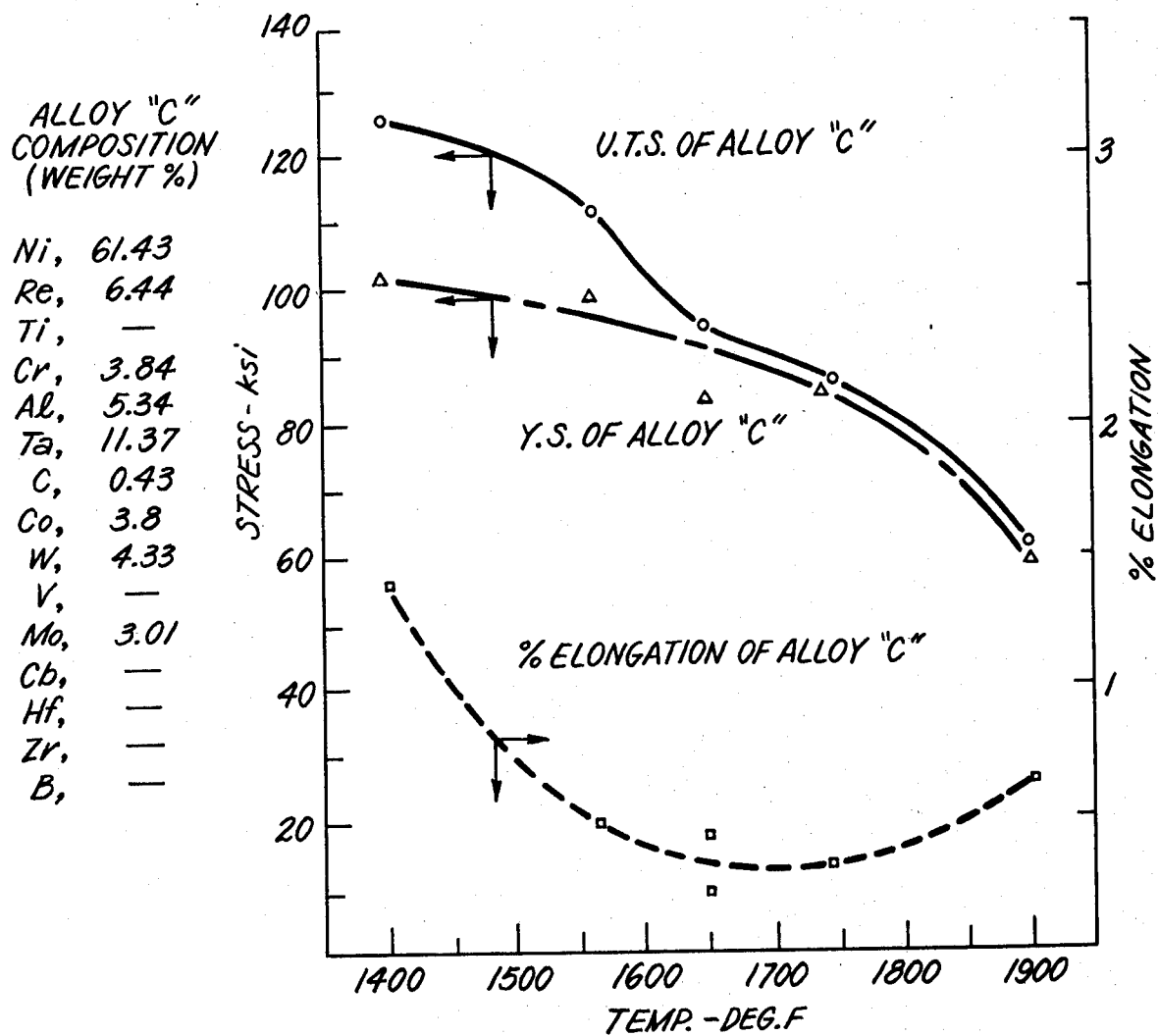
FIG. 3 is a graphical representation of the transverse tensile behavior including transverse ductility (elongation) of a unidirectionally solidified eutectic nickel-base Re containing carbide fiber reinforced superalloy of this invention. As illustrated, this alloy exhibits improved ductility with transverse tensile elongation greater than 1% below about 1450° F. and transverse tensile elongation within the range of 0.2-1% at all temperatures tested above about 1450° F.

The data represented in FIGS. 1-3 was based on the evaluation of a series of alloys of the compositions—noted in the FIGS.—which were melted in an inert argon atmosphere in Al$_2$O$_3$ or MgO crucibles, and chill-cast into copper bar molds. Specimen castings were planar front solidified to provide the unidirectional article specimens used for subsequent testing. Mechanical test specimens for longitudinal properties were machined from the ingots parallel to the growth direction. To obtain transverse properties, test specimen blanks were electrodischarge machined normal to the growth direction and ground into a mechanical test specimen configuration.

Set out in Table I hereafter is a resume of the Transverse Stress Test Data which formed the basis of the data illustrated by FIGS. 1-3:

TABLE I

| | Transverse Stress Test Data (As Solidified) | | | | |
|---|---|---|---|---|---|
| Example | Composition | Temp. (°F.) | 0.2% Y.S. (ksi) | U.T.S. (ksi) | Elong. (%) |
| 1 | Alloy "A" | 1400 | — | 87 | 0.16 |
| 2 | " | " | — | 82 | 0 |
| 3 | " | " | — | 94 | 0.04 |
| 4 | " | " | 100 | 104 | 0.36 |
| 5 | " | 1650 | — | 58 | 0 |
| 6 | " | " | — | 59 | 0 |
| 7 | " | " | — | 58 | 0 |
| 8 | " | 1900 | — | 39 | 0 |
| 9 | " | " | — | 44 | 0 |
| 10 | Alloy "B" | 1600 | — | 84 | 0 |
| 11 | " | 1900 | 66 | 66 | 0.2 |
| 12 | Alloy "C" | RT | 109 | 151 | 13 |
| 13 | " | 800 | 112 | 134 | 5.8 |
| 14 | " | 1200 | 106 | 126 | 2.9 |
| 15 | " | 1400 | 103 | 125 | 1.4 |
| 16 | " | 1560 | 109 | 113 | 0.49 |
| 17 | " | 1650 | 94 | 94 | 0.22 |
| 18 | " | 1650 | 81 | 94 | 0.44 |
| 19 | " | 1900 | 60 | 62 | 0.67 |

Set out in Table II hereafter is a resume of the Longitudinal Stress Test Data associated with the alloys of the compositions of FIGS. 1-3:

TABLE II

| Example No. | Composition | Temp. (°F.) | Stress (ksi) | Life (hrs) | R.A. (%) | Elong. (%) |
|---|---|---|---|---|---|---|
| 20 | Alloy "A" | 1742 | 70 | 19* | — | — |
| 21 | " | 1980 | 30 | 43* | — | — |
| 22 | Alloy "B" | 1742 | 70 | 6.55 | 17.1 | 14.4 |
| 23 | " | 1980 | 30 | 16.64 | 54.3 | 14.7 |
| 24 | Alloy "C" | 1742 | 70 | 7* | — | — |
| 25 | " | 1980 | 30 | 52* | — | — |

Longitudinal Stress Test Data (As Solidified)

*Extrapolated from other test conditions.

Figure 4:
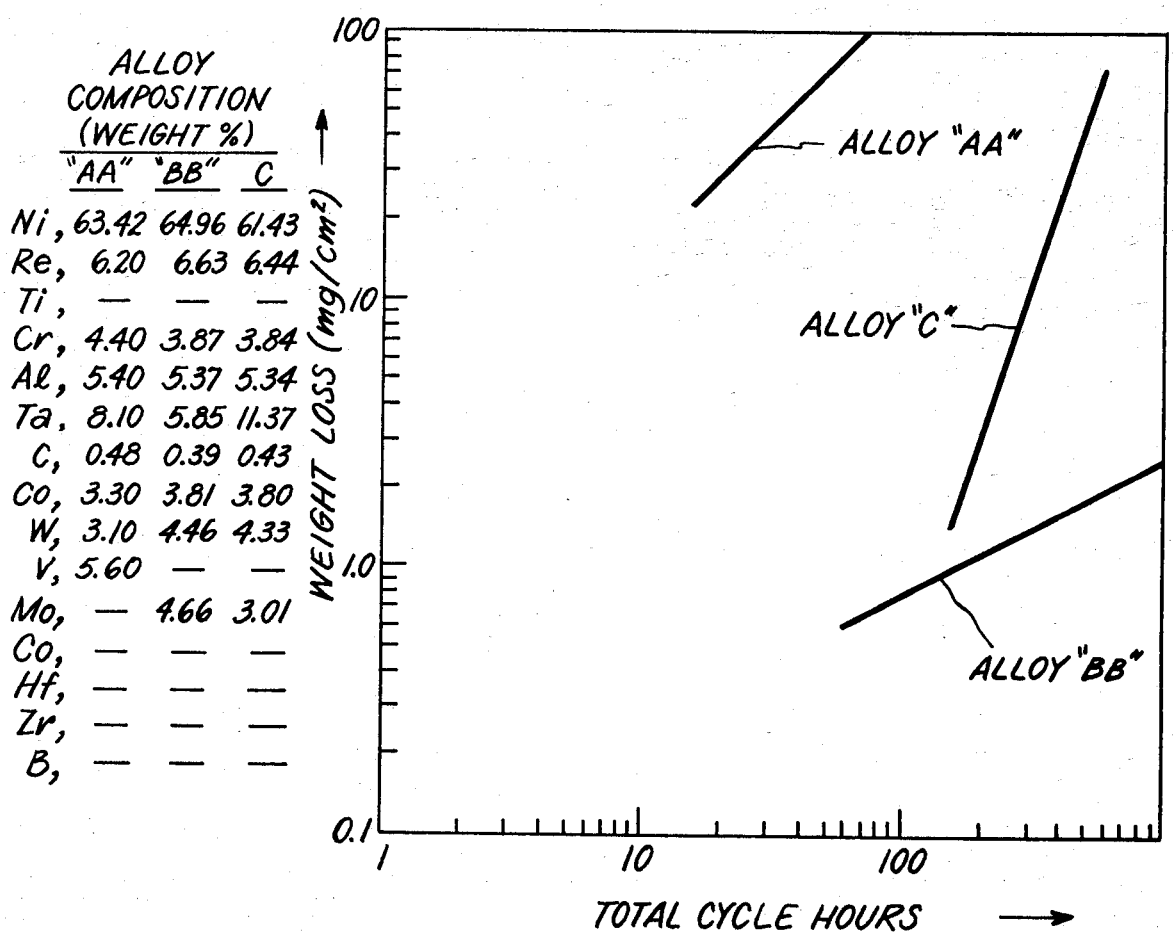

FIG. 4 is a graphical representation of the cyclic oxidation of a series of unidirectionally solidified eutectic nickel-base Re containing carbide fiber reinforced superalloys of the following compositions.

Alloy "AA" containing on a weight percent basis: 63.42 Ni, 6.20 Re, 4.40 Cr, 5.40 Al, 8.10 Ta, 0.48 C, 3.30 Co, 3.10 W, and 5.60 V.

Alloy "AA", of the composition of Smashey's U.S. 3,904,402 alloys exhibits high susceptibility to the deleterious effect of cyclic oxidation.

Alloy "BB" containing on a weight percent basis: 64.96 Ni, 6.63 Re, 3.87 Cr, 5.37 Al, 5.85 Ta, 0.39 C, 3.81 Co, 4.46 W and 4.66 Mo.

Alloy "C" containing on a weight percent basis: 61.43 Ni, 6.44 Re, 3.84 Cr, 5.84 Al, 11.37 Ta, 0.43 C, 3.80 Co, 4.33 W and 3.01 Mo.

Both Alloys "BB" and "C" of the compositions of this invention exhibit low susceptibility to the deleterious effects of cyclic oxidation.

Further illustration of the cyclic oxidation resistance of the alloys of this invention is furnished by the data summarized in Table III hereafter which compares commercial nickel-base superalloys Rene 75 and Rene 80. Alloy "AA" of Smashey's U.S. Pat. No. 3,904,402 with Alloy "BB" of this invention in cyclic oxidation test series run under analogous conditions. As illustrated, the cyclic oxidation resistance of Alloy "BB" is a significant and substantial improvement over Rene 75 and 80 and Alloy "AA".

TABLE III

Cyclic Oxidation Data 200° F. (or RT) to 2000° F.

| Alloy Composition | Ni-Base Alloy Class | No. Cycles | No. Hours | Weight Loss (mg/cm²) |
|---|---|---|---|---|
| Rene 75 | Superalloy | 4 | 100 | 8 |
| Rene 80 | Superalloy | 4 | 100 | 20 |
| Alloy "AA" | Eutectic superalloy | 163 | 163 | 245 |
| Alloy "BB" | Eutectic superalloy | 160*(1) | 160 | 1.1 |
| Alloy "BB" | Eutectic superalloy | 816(1) | 816 | 1.9 |

(1)Continuing test same alloy test specimen

A series of alloys of the compositions set out in Table IV were subjected to hot corrosion testing carried out using a diesel fuel containing 1% by weight of sulfur and 460 parts per million of sea salt at a temperature of 871° C. (1600° F.) during a 109 hour period. The depth of hot corrosion penetration of the alloys during the 109 hour test period is summarized in Table V.

TABLE IV

| Elements | Rene 80 | Rene 100 | Smashey's Alloy 13 U.S. Pat. No. 3,904,403 | Alloy "A" | Alloy "C" |
|---|---|---|---|---|---|
| Ni | bal. | bal. | bal. | 69.46 | 61.44 |
| Re | — | — | 6.2 | 6.3 | 6.44 |
| Ti | 5.0 | 4.2 | — | — | — |
| Cr | 14.0 | 9.5 | 4.4 | 1.9 | 3.84 |
| Al | 3.0 | 5.5 | 5.4 | 6.5 | 5.34 |
| Ta | — | — | 8.1 | 8.0 | 11.37 |
| C | 0.17 | 0.18 | 0.48 | 0.24 | 0.43 |
| Co | 9.5 | 15.0 | 3.3 | 3.7 | 3.8 |
| W | 4.0 | — | 3.1 | — | 4.33 |
| V | — | 1.0 | 5.6 | 3.9 | — |
| Mo | 4.0 | 3.0 | — | — | 3.01 |
| Cb | — | — | — | — | — |
| Hf | — | — | — | — | — |
| Zr | 0.03 | 0.06 | — | — | — |
| B | 0.015 | 0.015 | — | — | — |
| Other | | 1.0Fe | | | |

TABLE V

HOT CORROSION

| Alloy | Corrosion Depth (mils) |
|---|---|
| Rene 80 | 1.0 |
| Rene 100 | 23 |
| Smashey's Alloy 13 | 8 |
| Alloy "A" | 18 |
| Alloy "C" | 2.5 |

FIG. 5 is a graphical representation of the Larsen-Miller parameters of the Alloys "AA", "BB" and "C" comparing applied stress in "ksi" to the Larsen-Miller parameter given by the equation: $P = T(C + \log t_f) \times 10^3$, [°R,hr], where "T" is the temperature in degrees Rankin, "C" is equal to 20, and "t" is rupture time in hours, described in more detail in American Society of Engineers Transactions (1952) Volume 74, pages 765-771.

Alloy compositions in the scope of this invention which rely on tantalum carbide fibers as a reinforcing phase on

| Elements | Alloy Compositions | | |
|---|---|---|---|
| | Base | Preferred | More Preferred |
| Ni | bal. | bal. | bal. |
| Re | 2–9 | 2–9 | 5–8 |
| Ti | 0–0.8 | 0–0.8 | 0–0.8 |
| Cr | 0–10 | 2–10 | 3–8 |
| Al | 0–10 | 2–9 | 4–7 |
| Ta | 3–15 | 3–15 | 5–13 |
| C | 0.1–1.0 | 0.2–0.8 | 0.3–0.7 |
| Co | 0–10 | 0–10 | 2–6 |
| W | 0–10 | 0–10 | 3.5–6.0 |
| V | 0–1 | 0–0.5 | <0.2 |
| Mo | 2–10 | 2–8 | 2.5–5.5 |
| Cb | 0–3 | 0–2.0 | 0–1.0 |

As used herein and in the appended claims, the article of manufacture of this invention includes—however is not limited to—a unidirectionally solidified anisotropic metallic composite body comprising a nickel-base superalloy containing a gamma/gamma-prime matrix wherein the matrix contains a solid solution gamma phase and an ordered equiaxed precipitate strengthened gamma-prime phase, further wherein the gamma/gamma-prime matrix has an aligned eutectic reinforcing fibrous carbide phase, primarily tantalum carbide, embedded therein.

Based on the Figures, Tables, and Alloy Compositions set out herein, variations in the alloy compositions—without departing from the concept of Re containing carbide fiber reinforced eutectic nickel-base superalloys—which exhibit transverse ductility, cyclic oxidation resistance, hot corrosion resistance and high temperature strength properties—will be apparent to those skilled in the art.

I claim:

1. An article of manufacture having transverse ductility, cyclic oxidation resistance, hot corrosion resistance, and high temperature strength properties comprising a unidirectionally solidified anisotropic metallic composite body comprising:
   a matrix of a Ni-base superalloy consisting essentially of about, on a weight basis, 2-9% Re, less than 0.8% Ti, at least 3.01% Mo, less than 1% V, along with elements selected from the group consisting of Cr, Al, Ta, C, Co, W, Cb, and
   an aligned eutectic carbide reinforcing fibrous phase.

2. The article of claim 1, wherein said matrix contains an ordered equiaxed precipitate strengthened phase.

3. The article of claim 2, wherein the superalloy consists essentially of about, on a weight basis, 2-9% Re, less than 0.8% Ti, 0-10% Cr, 0-10% Al, 3-15% Ta, 0.1-1% C, 0-10% Co, 0-10% W, 0-1.0% V, 3.01-10% Mo, 0-3% Cb, the balance being essentially Ni and incidental impurities.

4. The article of claim 3 wherein the superalloy consists essentially of about, on a weight basis, 2-9% Re, less than 0.8% Ti, 2-10% Cr, 2-9% Al, 3-15% Ta, 0.2-0.8% C, 0-10% Co, 0-10% W, 0-0.5% V, 3.01-8% Mo, 0-2% Cb, the balance being essentially Ni and incidental impurities.

5. The article of claim 4 wherein the superalloy consisting essentially of about, on a weight basis, 5-8% Re, less than 0.8% Ti, 3-8% Cr, 4-7% Al, 5-13% Ta, 0.3-0.7% C, 2-6% Co, 3.5-6.0% W, <0.2% V, 3.01-5.5% Mo, 0-1% Cb, the balance being essentially Ni and incidental impurities.

6. An alloy capable of developing in a unidirectionally solidified anisotropic article having transverse ductility, cyclic oxidation resistance, hot corrosion resistance, and high temperature strength properties, the alloy consisting essentially of about, on a weight basis, 2-9% Re, less than 0.8% Ti, 0-10% Cr, 0-10% Al, 3-15% Ta, 0.1-1% C, 0-10% Co, 0-10% W, 0-1.0% V, 3.01-10% Mo, 0-3% Cb, the balance being essentially Ni and incidental impurities.

7. The alloy of claim 6 wherein the superalloy consists essentially of about, on a weight basis, 2-9% Re, less than 0.8% Ti, 2-10% Cr, 2-9% Al, 3-15% Ta, 0.2-0.8% C, 0-10% Co, 0-10% W, 0-0.5% V, 3.01-8% Mo, 0-2% Cb, the balance being essentially Ni and incidental impurities.

8. The alloy of claim 7 wherein the superalloy consists essentially of about, on a weight basis, 5-8% Re, less than 0.8% Ti, 3-8% Cr, 4-7% Al, 5-13% Ta, 0.3-0.7% C, 2-6% Co, 3.5-6.0% W, <0.2% V, 3.01-5.5% Mo, 0-1% Cb, the balance being essentially Ni and incidental impurities.

9. The alloy of claim 8 wherein the superalloy consists essentially of about, on a weight basis, 6.44% Re, 3.84% Cr, 5.34% Al, 11.37% Ta, 0.43% C, 3.8% Co, 4.33% W, 3.01% Mo, 61.43% Ni and incidental impurities.

10. The alloy of claim 8 wherein the superalloy consists essentially of about, on a weight basis, 6.63% Re, 3.87% Cr, 5.37% Al, 5.85% Ta, 0.39% C, 3.81% Co, 4.46% W, 4.66% Mo, 64.96% Ni and incidental impurities.

* * * * *

UNITED STATES PATENT AND TRADEMARK OFFICE
CERTIFICATE OF CORRECTION

PATENT NO. : 4,284,430
DATED : August 18, 1981
INVENTOR(S) : Michael F. Henry

It is certified that error appears in the above—identified patent and that said Letters Patent is hereby corrected as shown below:

Column 5, line 24, claim 3, after "0.1-1% C," insert

--0-10% Co,--

Signed and Sealed this

Thirteenth Day of July 1982

[SEAL]

Attest:

Attesting Officer

GERALD J. MOSSINGHOFF

Commissioner of Patents and Trademarks